(12) United States Patent
Liu et al.

(10) Patent No.: US 11,772,127 B2
(45) Date of Patent: Oct. 3, 2023

(54) METHODS FOR APPLYING A BLANKET POLYMER COATING TO A SUBSTRATE

(71) Applicant: ENTEGRIS, INC., Billerica, MA (US)

(72) Inventors: Yan Liu, Lexington, MA (US); Yuxuan Liu, Wayland, MA (US); Chandra Venkatraman, Tyngsboro, MA (US); Carlo Waldfried, Middleton, MA (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/867,530

(22) Filed: Jul. 18, 2022

(65) Prior Publication Data

US 2023/0042148 A1 Feb. 9, 2023

Related U.S. Application Data

(60) Provisional application No. 63/223,818, filed on Jul. 20, 2021.

(51) Int. Cl.
*B05D 3/06* (2006.01)
*B05D 1/02* (2006.01)
*B05D 3/02* (2006.01)
*H01L 21/683* (2006.01)

(52) U.S. Cl.
CPC .............. *B05D 3/06* (2013.01); *B05D 1/02* (2013.01); *B05D 3/0254* (2013.01); *H01L 21/6833* (2013.01)

(58) Field of Classification Search
CPC .............................. B05D 3/06; B05D 3/0254
See application file for complete search history.

(56) References Cited

U.S. PATENT DOCUMENTS 9,721,821 B2    8/2017  Lin
2015/0294891 A1*  10/2015  Lin ................ H01L 21/6875
                                                            216/48
2019/0086816 A1*   3/2019  Krol .................. B05D 3/0254

* cited by examiner

*Primary Examiner* — Nathan T Leong

(57) ABSTRACT

Described are techniques for applying a cured polymeric blanket coating onto a surface, specifically for applying a blanket-coated cured polymeric coating onto a surface of a substrate that is useful as an electrostatic chuck for processing semiconductor wafers.

19 Claims, 3 Drawing Sheets

METHODS FOR APPLYING A BLANKET POLYMER COATING TO A SUBSTRATE

CROSS REFERENCE TO RELATED APPLICATIONS

This application claims the benefit under 35 USC 119 of U.S. Provisional Patent Application No. 63/223,818, filed on Jul. 20, 2021, the disclosure of which is hereby incorporated by reference in its entirety.

FIELD

The following description relates to techniques for applying a cured polymeric blanket coating onto a surface, specifically for applying a blanket-coated cured polymeric coating onto a surface of a substrate useful as an electrostatic chuck for processing semiconductor wafers.

BACKGROUND

An electrostatic chuck is a device that holds and supports a substrate, typically a semiconductor wafer, during a manufacturing process. The chuck also removes heat from the substrate without mechanically clamping the substrate.

During use of an electrostatic chuck, the back side of a substrate is held to an upper surface of the electrostatic chuck by an electrostatic force. The substrate is separated from one or more electrodes that are part of the electrostatic chuck by a surface layer of material that covers the electrode. In a Coulombic chuck, the surface layer is electrically insulating, while in a Johnsen-Rahbek electrostatic chuck, the surface layer is weakly conducting.

The upper surface of the electrostatic chuck may be entirely flat or may have one or more protrusions, projections or other surface features that further separate the back side of the substrate from the covered electrode. Heat that is contained in the substrate during processing can be transferred away from the substrate and to the electrostatic chuck by contact heat conduction with the protrusions, or by gas heat conduction with a cooling gas that flows between the upper surface of the chuck and the bottom surface of the substrate. Contact heat conduction is generally more efficient than gas heat conduction in removing heat from the substrate. However, controlling the amount of contact between the substrate and the protrusions can be difficult.

In microelectronics production, as semiconductor and memory device geometries become progressively smaller and the sizes of wafers, flat screen displays, reticles, and other processed substrates become progressively larger, the tolerance for particulate contamination of a wafer surface continues to become more stringent. The effect of particle debris derived from an electrostatic chuck is of particular concern because a semiconductor wafer will physically contact the electrostatic chuck clamping surface. If the upper surface of the electrostatic chuck allows any particulate to become entrapped between the upper surface of the electrostatic chuck and the lower surface of the substrate, the substrate may be deformed by the entrapped particle. For example, if the back side of a wafer is clamped electrostatically against a flat reference surface, the entrapped particle could cause a deformation of the front side of the wafer, which will therefore not lie in a flat plane. A micron-scale particle (e.g., a 10-micron particle) on a flat electrostatic chuck can displace the surface of a wafer supported by the chuck by an amount that is significant during processing of the wafer.

SUMMARY

There exists in the arts of semiconductor and microelectronic processing technology, and electrostatic chuck technology, a continuing need for improved techniques to prepare electrostatic chuck surfaces. There also exists ongoing need for improved electrostatic chuck surfaces, for example electrostatic chuck surfaces that produce lower amounts of particulate debris during use.

As described in the present description, novel and inventive methods for applying a layer (a.k.a. "film") of a cured polymer onto a surface of an electrostatic chuck have been identified. The surface may be completely flat, or may include three-dimensional structure(s) such as a main field and protrusions that contact a lower surface of a wafer being supported by the chuck, or gas seal rings. The cured polymer layer can be in a form of a cured polymer blanket coating that is applied and cured as a coating that covers the entire surface, without selectively curing any portion of the applied spray solution and without selectively removing any portion of the applied spray solution.

The cured polymeric blanket coating is prepared by applying a coating of liquid spray solution onto the entire surface area of the electrostatic chuck, and then curing polymer of the blanket coating over the entire surface area of the blanket coating. The coating is non-selectively cured, i.e., cured in a non-patterned manner, particularly without masking a portion of the coating. After applying the liquid polymer solution onto the surface, and before a final curing step (e.g., a "hard bake" step), no portion of the applied spray solution coating is removed. Upon final curing of the applied spray solution coating, the entire cured polymer coating remains present over the entire surface of the substrate as a cured polymer blanket coating.

In one aspect, the disclosure relates to a method of applying a blanket-coated polymeric coating to a surface of an electrostatic chuck. The method includes: applying a spray solution to the surface of the electrostatic chuck to form a spray solution coating over the entire surface, the spray solution comprising radiation-curable polymer; exposing the entire surface of the spray solution coating to radiation to form a radiation-cured polymer coating; and heating the radiation-cured polymer coating to an elevated temperature to remove solvent from the radiation-cured polymer coating.

Figure 1A:
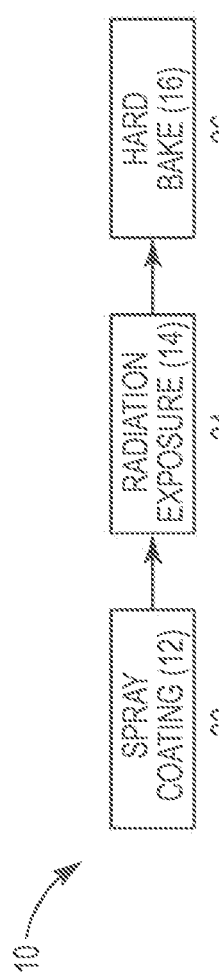
FIGS. 1A and 1B show steps of an example method as described.

All figures are schematic and not to scale.

DETAILED DESCRIPTION

Described as follows are methods for applying a layer (a.k.a. "film") of cured polymer onto a surface of an electrostatic chuck, the layer being in a form of a cured polymer blanket coating. The blanket coating is prepared by applying a coating of liquid polymer solution onto the entire surface area of the electrostatic chuck, and then curing polymer of the blanket coating over the entire surface area of the blanket coating. The entire area of the coating is fully cured in a non-selective manner, i.e., fully cured in a non-patterned manner, particularly without masking any portion of the coating in a manner that intentionally, by design, prevents curing of the masked area of the coating while allowing curing of another (un-masked) area of the coating. After applying the liquid polymer solution onto the surface, no portion of the coating is removed, and upon curing the entire original coating remains present over the entire surface as a cured polymer blanket coating.

As used herein the term "cured," as in a cured coating, a cured blanket coating, or a cured polymer, refers to a coating or polymer of a coating that is fully cured for an intended use of the coating. The polymer may be cured by any useful technique, depending on the type of polymer and cure system. By example curing techniques, a polymer may be cured by one or more of: the polymer being exposed to radiation to cause the polymer to cure by a radiation-induced mechanism; the polymer being exposed to elevated temperature to cause the polymer to cure by a heat-induced mechanism; a combination of radiation and heating. A cured polymer that has been cured to a maximum extent possible for the polymer, or nearly so, or that is fully cured for an intended application, such as to function as a layer of an electrostatic chuck), may also be referred to as "fully cured."

A polymer that has been only partially cured may be referred to as "partially-cured." A polymer that has been partially or fully cured by exposure to radiation can be referred to as "radiation-cured."

A polymer coating that has been exposed to a heating step to remove solvent from a coating (e.g., to a level of less than 10 or 5 percent solvent relative to an amount of solvent of a coating as the coating is applied) may be referred to as "dried."

Polymeric materials have been used on surfaces of electrostatic chucks for constructing three-dimensional structures such as protrusions and sealing rings. The polymeric structures are prepared by methods of applying and selectively curing and removing photo-patterning polymer, to produce desired three-dimensional structures at locations over a main field of the surface. See, e.g., U.S. Pat. No. 9,721,821. The process of forming the three-dimensional structures may involve applying a polymer layer onto a surface, selectively curing a portion of the polymer layer, and selectively removing a portion of the polymer layer.

According to the present description, a cured polymer coating that is formed on a surface of an electrostatic chuck is useful as a polymeric layer for supporting a semiconductor wafer during processing of the wafer. The cured (i.e., fully cured) polymer of the coating has mechanical properties that are useful to provide support for a wafer at the upper surface of the electrostatic chuck, as well as useful heat conduction between the bottom surface of the wafer and the upper surface of the chuck. The cured polymer is also effective as a blanket coated polymer film at the upper surface of the chuck that prevents particles of debris from being removed from the chuck surface, or prevents contact between the chuck surface and a bottom side of a wafer that might generate debris from either surface.

The term "upper surface" (alternately "supportive surface") of an electrostatic chuck refers to an upper (top) surface of an electrostatic chuck that, during use of the electrostatic chuck, supports a semiconductor wafer for processing the wafer.

The surface of the electrostatic chuck that is being coated by the polymer, as described, is a substantially flat, e.g., planar surface that may be entirely flat over an entire area of the surface, or that may include a primary continuous flat surface (sometimes referred to as a "main field") that extends over a majority of the surface, from which a number of structures extend vertically.

The surface may be substantially continuous and uninterrupted, or may include openings that extend vertically through the surface. An example of an opening may be to allow access from a location that is below the upper surface of the chuck, through the chuck, to a bottom surface of a supported wafer, for example to allow a mechanical device such as a lift pin to contact the lower surface of the wafer. Another example of an opening may be for the purpose of gas flow below the substrate, to supply a cooling gas or to affect pressure in the space between the upper surface of the electrostatic chuck and a lower surface of a wafer that is being supported by the electrostatic chuck.

An example of a type of vertically-extending structure located on a main field may be a plurality of small-dimension circular (cylindrical) "protrusions" of a type that is often distributed at spaced locations on a surface of an electrostatic chuck for contacting a bottom surface of a wafer to support the wafer above a main filed of the surface, and to create space between the bottom surface of the wafer and the main field of the electrostatic chuck. Protrusions of this type can be spaced horizontally, in two dimensions, and distributed over an upper surface of an electrostatic chuck in any useful pattern, and may be present in any useful number. The protrusions are often, but not necessarily, circular when viewed from above the electrostatic chuck. The protrusions can have dimensions (area and height) that are effective to support the wafer above the main field of the surface of an electrostatic chuck. Example protrusions may have a height of up to 50 or 100 microns, such as in a range from about 3 microns to about 12 microns, and may be circular with a diameter of in a range from about 500 to 1100 microns.

A different example of a surface structure may be a structure that extends vertically above the main field, and along a straight or curved length over the surface of the main field, e.g., as a circular ring. One examples of a ring structure on a surface of electrostatic chucks may be a ring that is located at a perimeter of a substrate. Another example of a ring structure is a ring seal that surrounds an aperture that passes vertically through the substrate or the upper layer of the substrate. The structure of the seal ring may have any useful dimensions, such as a height in a range from about 3 to about 12 microns above the main field. A length of a seal ring may be a length equal to the circumference of a substrate perimeter, or slightly greater than a circumference of a vertical opening in the substrate. A width of a seal ring may be any useful width, such as a width in a range from 100 to 1000 microns.

In addition to these types of described structures, a surface that is coated by a cured polymer as described may also include other functional layers, for example a conductive layer or a charge-dissipation layer, which may be located at portions of a main field or at upper surfaces of protrusions.

The surface of the electrostatic chuck that is being coated, including any protrusions, conductive layers, charge-dissipation layers, etc., can be made of any of a variety of different types of materials known for use as materials of a multi-layer upper portion of an electrostatic chuck. The main field and any protrusions may all be made of a single type of material, i.e., these structures may all be made of one single material, such as a ceramic. Alternately, a main field may be made of one or more types of materials, and protrusions may be made of the same or different materials compared to the main field. Example materials generally include ceramics, metals (e.g., conductive metals), polymers, silicon carbide, diamond-like-carbon, among others.

The surface, before a polymer is applied as described, while visually flat with optional vertically-extending structure, will still have a measurable roughness on a micrometer or nanometer-scale. Two-dimensional areas of the surface will have a measurable roughness, including upper surfaces of vertically-extending structures such as protrusions, as well as at areas of a main field. The roughness of any of the areas of the surface may be measured by known techniques and equipment, such as by using a profilometer. Example roughness values measured of a surface of an electrostatic chuck, before being coated with polymer as described, may be in a range from 0.01 to 10 microns Ra.

The polymer that is applied to the surface may be any curable polymer that can be prepared to form a liquid spray solution that can be applied as a film over a structured or non-structured surface of an electrostatic chuck (e.g., by spraying or application with a roller, and then cured. Non-limiting examples include polymer compositions that are sometimes referred to as photo-curable or photo-patternable polymer materials that are known in the field of manufacturing semiconductor and microelectronic devices, including electrostatic chucks. These include, generally, polymers that are epoxy-based, polyimide-based, and benzocyclobutene-based photo-patternable polymer compositions. See, e.g., U.S. Pat. No. 9,721,821.

The polymer is curable, and is applied to the surface as a liquid film and then cured (and, thereby, solidified) by a chemical curing mechanism. The chemical curing mechanism may be one that is activated by radiation, heat, or a combination of radiation and heat, e.g., by of one or more of: (i) thermal energy, (ii) UV-VIS radiation energy, (iii) IR radiation energy, (iv) UV, DUV, EUV, or X-ray radiation energy, (v) microwave radiation energy, (vi) electron flood exposure, (vi) Gamma-ray exposure, or a combination of these.

The polymer, in a polymerized state, after curing and drying to remove solvent used in the spray coating step, may have useful mechanical properties that include desired thermal conductivity, desired flexibility (e.g., modulus), hardness, tensile strength, etc.

The polymer may be coated, cured, and dried to produce a relative uniform thickness of the cured polymer coating that is in a range below 6 microns, e.g., from 3 to 5 microns.

For applying the polymer to the surface, the polymer can be formed into a liquid spray solution that contains the polymer dissolved in solvent. The spray solution can be sprayed onto the surface by standard spray equipment or by a roller applicator, and has film-forming properties when applied to the materials of the surface, meaning that when applied to the surface the spray solution wets the surface and forms an un-interrupted film (a.k.a. "coating" or "layer") that is substantially uniform and continuous over the entire surface. The spray solution is applied as a blanket coating, is subsequently cured and dried over the entire area of the blanket coating, and remains in place over the entire surface of the electrostatic chuck as a cured blanket polymer coating.

With reference to coatings as presently described, a coating that is "blanket-coated," i.e., a "blanket coating," is a coating that extends over an entire surface as a continuous, non-interrupted, coating or film. A spray coating that is applied as a blanket coating over an entire surface of an electrostatic chuck can be cured and solidified to form a "cured blanket polymer coating" (or "cured blanket coating," for short) by a curing step that cures the entire blanket coating. The applied spray-coated blanket coating is cured (fully cured) non-selectively over its entire surface, and no portion remains un-cured or partially-cured, and no portion is removed after being applied. The resultant cured blanket coating is a continuous, un-interrupted, cured blanket coating (film) that covers the entire surface of the electrostatic chuck.

A blanket coating as applied and as cured that is "continuous" over an entire area of a surface does not contain any open areas that are intentionally open due to a step of a method that intentionally causes a portion of the spray solution coating to be un-cured on the surface while other portions are cured, and with the un-cured portion being removed. While not preferred, a blanket coating may contain very small amounts of open surface area due to coating defects such as pinholes or other coating imperfections, or due to a lack of coverage of a vertical surface, e.g., that is part of a three-dimension structure such as a vertical "sidewall" portion of a protrusion, ring seal, or the like. In this respect, the blanket coating is applied by a spray coating method that is designed and intended to place a continuous, un-interrupted and uniform layer of the spray solution over the entire surface of the electrostatic chuck, including all vertical surfaces, and the entire spray solution coating is intended to be cured without any significant portion of the spray solution coating being intentionally prevented from being cured, such as by use of a mask. No portion of the blanket coating is intentionally removed from the surface after the spray solution is applied to the surface. To the extent that any portion of the original (previously-exposed) upper surface of the electrostatic chuck is not coated with spray solution, or a layer of cured polymer derived from the spray solution, the non-coated portion may result from a coating defect, such as from a failure of the spray solution to contact a vertical surface of a vertically-extending structure such as a protrusion that is located at the surface.

In comparison, a cured polymeric coating that is prepared by a step that includes a photo-patterning step is not a blanket coating. A photo-patterning step, sometime referred to as "photolithography," is a known technique for selectively curing a portion of a layer of photo-curable polymer located at a substrate surface, and, following the selective cure step, removing an un-cured portion the selectively-cured layer. The selective curing step is performed by selectively applying radiation to only a portion of the layer by masking off a portion of the layer that is not intended to be exposed to the radiation and applying radiation through the openings in the mask to the non-masked portion. The masked or un-masked portion may be cured, and an un-cured portion can be subsequently removed (in a "developing" step) to leave behind a desired portion of the original layer.

Figure 1B:
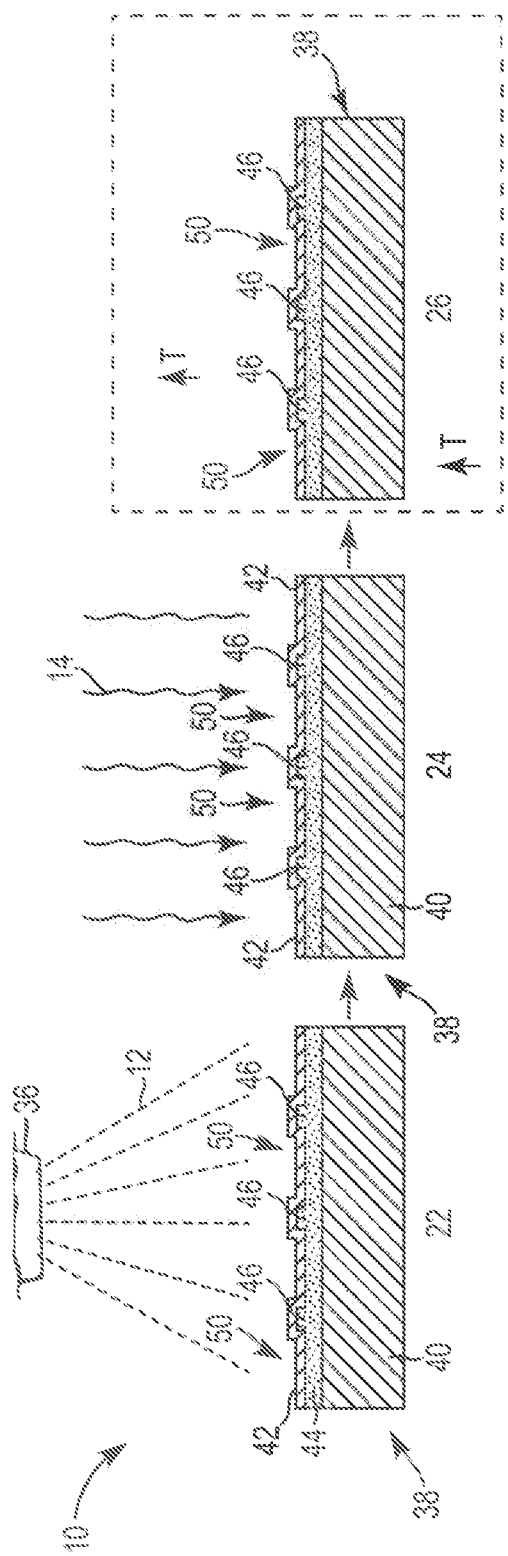

Referring to FIGS. 1A and 1B, FIG. 1A illustrates steps of a method schematically, and FIG. 1B shows steps as applied to an illustrated substrate 38. According to method 10, in a first step 22, a liquid spray solution 12 is applied onto a surface of substrate 38 by spraying the spray solution from spray nozzle 36 to form spray solution coating 42, which is uniformly applied over the entire surface of the substrate, preferably including all vertical sidewalls. As illustrated, substrate 38 includes lower layer 40 and upper layer 44, which may be of any material, such as ceramic. Upper layer 44 includes optional protrusions 46, which may also be made of any material, such as ceramic. Between protrusions 46 are areas of open field 50. Optionally but not as illustrated, substrate 38 may include other features such as a conductive layer, a charge control layer, one or more seal rings, etc.

In a particular embodiment upper layer 44, including protrusions, is a ceramic layer prepared by a bead blast method, with masking, to produce open field 50, protrusions 46, and one or more optional seal rings (not shown), all made from a bead-blasted ceramic layer. The ceramic surface may have a roughness in a range from 0.010 to 10 microns (Ra).

During the spray solution application step, substrate 38 may optionally be heated, but may be un-heated, e.g., held at ambient temperature, such as at a range of from 20 to 23 degrees Celsius. For certain spray solutions, which may contain a high amount (e.g., at least 75, 80, or 90 weight percent) of organic solvent, ambient temperature can be preferred to avoid un-desired evaporation of the organic solvent from the spray solution upon contact with the surface.

Spray solution 12 contains curable polymer dissolved in solvent, and has physical properties (at ambient temperature, e.g., between 20 and 23 degrees Fahrenheit) that include flow properties (e.g., viscosity) and surface tension properties that allow the spray solution to wet a substrate surface and become evenly coated as a thin film blanket coating on the substrate surface, preferably with complete coverage of all surfaces, including any vertical sidewalls of vertically-extending surface structures (e.g., protrusions). In some embodiments the curable polymer may be conductive so that it conducts electricity. In some embodiments, the curable conductive polymer may be at least one of polyacetylene (PAC), polyfluorene, polyphenylene, polyphenylene vinylene, polypyrene, polyazulene, polynaphthalene, polypyrrole (PPY), polycarbazole, polyindole, polyazepine, polyaniline (PANI), polyacene, polythiophene (PT), polythiophene vinylene, poly(p-phenylene sulfide) (PPS), poly (p-phenylene vinylene) (PPV), polypyridine, poly(3,4-ethylenedioxythiophene) (PEDOT), polystyrene sulfonate (PSS), poly(triaryl amine) (PTAA), poly(hydrooxymethyl 3,4-ethylenedioxythiphene) (PEDOT-OH), derivatives of any of the foregoing, or any combination thereof.

The spray solution can contain amounts of solvent and polymer that provide for effective spray application of a thin film blanket coating over all surfaces of a substrate, even on a substrate that includes three-dimensional structures such as protrusions. To allow for spray solution a thin, even coating, the spray solution can contain a relatively high percentage of organic solvent, for example at least 75, 80, or 90 percent by weight organic solvent, in combination with an amount of polymer that is below 25, 20, or 10 weight percent based on total weight of the spray solution.

The type of solvent used can be any solvent, typically a volatile organic (non-water) solvent that is capable of dissolving the polymer and forming a solution that can be spray coated onto a surface as described. Non-limiting examples of useful solvents include gamma butyrolactone, propylene glycol methyl ether acetate, acetone, dodecane, cyclopentanone, and similar organic solvents.

The spray solution, including a relatively low percent of solid polymer and a relatively high percent of organic solvent, can have a viscosity that will produce a thin, even coating over the entire area of the substrate, preferably including sidewalls of three-dimensional structures such as protrusions. A useful viscosity may be below 20 centipoise, below 10 centipoise, or below 9 centipoise, for example in a range from 3 to 9 centipoise.

Viscosity of a spray solution can be calculated by various methods. To prepare a spray solution for use in a coating method as described, a useful method is to start with a commercially-available curable polymeric photoresist solution, and add solvent to reduce the viscosity of the photoresist solution. The viscosity of the diluted solution will be reduced relative to the viscosity of the commercial solution. The viscosity of the commercial solution is known, as part of the product specification. The viscosity of the diluted solution can be calculated For purposes of the present description and claims, viscosity of a spray solution can be calculated using a derivative of the Arrhenius equation:

$$\ln \eta_{12} = x_1 \ln \eta_1 + x_2 \ln \eta_2$$

wherein:
η12: Mixture intrinsic viscosity.
η1: Solution 1 viscosity, e.g., from a commercial photoresist product specification
η2: Solution 2 viscosity.
X: Mole fraction of liquid 1 and liquid 2.

The calculation can be used to estimate room a viscosity, at room temperature (e.g., 20 degrees Celsius), of a solution made by combining a first solution (Solution 1), which is a commercial photoresist product, and a second solution (Solution), which is an organic solvent.

The spray solution can be applied to the substrate surface by any useful spray coating equipment, using any useful conditions. In certain embodiments of a spray coating step, the pattern of spraying the spray solution onto the substrate surface may be in a single direction.

The spray solution may be coated to relative uniform thickness over the entire surface, for example to a thickness in a range below 6 microns, e.g., from 3 to 5 microns.

Figure 2A:
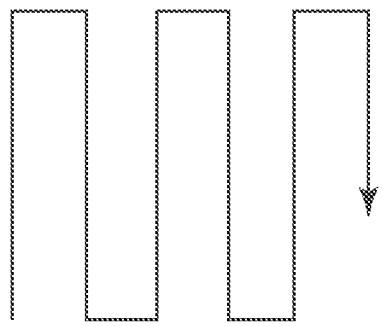
FIGS. 2A and 2B show example spray paths for coating a substrate surface.
Figure 2B:
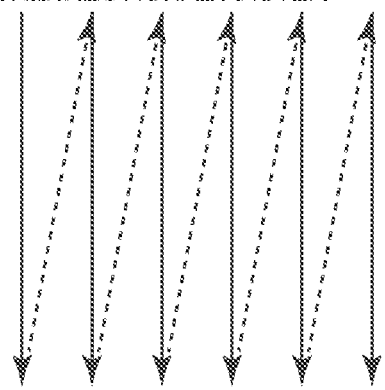

FIGS. 2A and 2B show examples of spray patterns for applying a spray solution as described. FIG. 2A shows a conventional or standard pattern ("standard raster") by which a spray coating nozzle alternately applies spray solution in one direction, then in an opposite (180 degrees opposed) direction, while moving sideways (left-to-right as illustrated) to cover the entire surface of a substrate. The spray solution is applied during each pass over the substrate, in the first direction and in the second (opposite) direction.

FIG. 2B shows an alternate spray pattern, which may be presently preferred relative to the pattern of FIG. 2A. FIG. 2B shows a unidirectional spray pattern ("unidirectional raster") by which a spray coating nozzle applies spray solution in only one direction, from end-to-end, as the nozzle traverses the substrate surface. The nozzle begins at a position at a first end of the substrate. The nozzle applies a first path of spray solution while moving in a first direction from the first end of the substrate toward a second and opposite end of the substrate (see the solid lines and arrows, showing movement from a first substrate end toward a second substrate end while spraying). The nozzle is then returned to the first end, i.e., moves in the opposite (180 degrees opposed) direction (see the dashed lines), while the nozzle is turned off and does not emit a spray of the spray solution. The nozzle also moves incrementally sideways (left-to-right as illustrated) and then applies and then applies a subsequent path of spray solution, adjacent to the first path, while again moving in a direction from the first end of the substrate to the second end of the substrate.

During a step of spraying the spray solution onto a surface of an electrostatic chuck, features such as certain openings (e.g., openings sized for a lift pin, openings sized for a ground pin) can be plugged.

After the spray coating step, in a subsequent step, 24, the blanket coating of the spray solution is exposed to a form of electromagnetic radiation 14 to cause the polymer of the spray solution coating to become chemically cured (at least partially-cured) and hardened or solidified, i.e., radiation-cured. By radiation exposure step 24, the entire surface area of the spray solution coating is uniformly exposed to radiation 14, and no portions of the surface are selectively exposed to the radiation or selectively prevented from being exposed to the radiation, such as by masking the surface in a manner used in photo-patterning techniques.

Optionally the coated substrate may be heated (in a "soft bake" step) after spray coating 22 and before radiation exposure 24. However, a heating step between spray coating step 22 and radiation exposure 24 is not necessary and can be excluded in certain example methods.

After radiation exposure 24, the at-least-partially cured polymer coating ("radiation-cured" polymer coating) is exposed to elevated temperature, e.g., in an oven as indicated by dashed lines of FIG. 1C. The radiation-cured polymer coating contains solvent of the spray solution (e.g., up to or in excess 50, 60, 70, 75, or 80 weight percent solvent). The solvent can be removed by heating the radiation-cured polymer coating at elevated temperature in a "hard bake" step. Hard bake step 26 can be effective to remove solvent from the radiation-cured polymer coating, to effect additionally curing of the polymer of the radiation-cured polymer, or both. Hard bake 26 can include exposing the substrate, with the radiation-cured polymer coating, to an elevated temperature for a period of time that is effective to remove solvent from the radiation-cured coating, to additionally cure polymer of the radiation-cured coating, or both. The amount of time of exposure to the elevated temperature, and the temperature, can be selected based on factors such as a coating thickness, the type of radiation-curable polymer of the coating, and desired final properties of the cured (fully-cured) polymer blanket coating. Examples of useful temperatures can be in a range from 150 to 400 degrees Celsius. Examples of useful amounts of time of a hard bake step can be at least 45 or 60 minutes, e.g., from 45 to 120 minutes.

The cured polymer coating, after a hard bake step, can preferably have a relative uniform thickness over the entire surface, for example to a thickness in a range below 6 microns, e.g., from 3 to 5 microns.

The following table lists some specific examples of process features of an example method as described.

| Process step | process parameter | |
|---|---|---|
| Target thickness | Coating thickness | 3 to 5 um (4 +/− 1 um) |
| Pre-heat | Pre-heat temperature (substrate) | Room temperature |
| Spray | Spray speed | 152 mm/sec |
| | Flow rate of Spray Solution | 1.6 ml/min |
| | Air pressure | 20 psi |
| | Height of spray nozzle | 60 mm |
| | Wait time after spray | 10 mins |
| Soft bake 1 | Bake temperature | N/A |
| | Bake time | 0 |
| UV Exposure | UV light intensity | 300 mJ/cm² |
| | UV time | 6 mins |
| Soft bake 2 | Bake temperature | N/A |
| | Bake time | 0 |
| Development | Soak time in developer | 0 |
| Hard bake | Bake temperature | RT to 200° C.; then soak at 200° C. |
| | Bake time | 3 hours total. (~70 mins ramp up to 200° C.; soak at 200° C. for 110 mins) |

In comparison to photo-patterning methods, method 10 of FIGS. 1A and 1B does not include any "developing" step or other step by which a portion of an applied spray solution coating (film) is intended to be un-cured, or is removed from a substrate surface after being placed onto the substrate surface. Method 10 of FIGS. 1A and 1B does not include a step of selectively exposing applied to radiation to only a portion of an applied spray solution coating, while another portion of the applied spray solution coating is selectively shielded from the radiation (e.g., using a mask).

Figure 3:
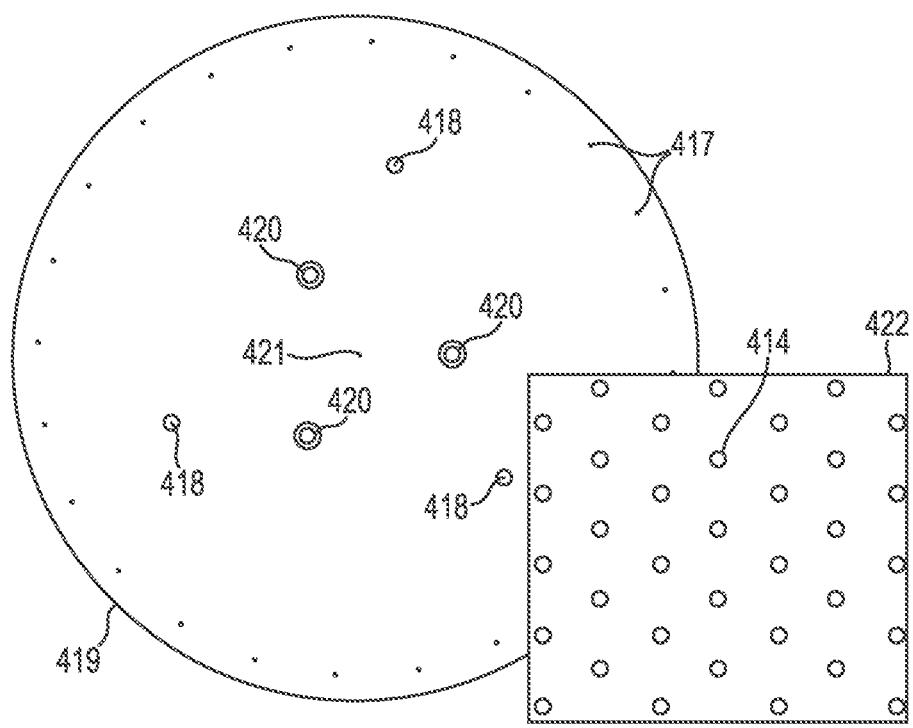
FIG. 3 shows an example of an appearance of an upper surface of an electrostatic chuck as described.

FIG. 3 shows a top-view of an upper surface of an example electrostatic chuck as described. In one example, the electrostatic chuck may have a diameter that may be, for example, 300 mm, 200 mm or 450 mm. The electrostatic chuck surface includes gas inlets 417, ground pin openings ("passages") 418, gas seal ring 419 at a perimeter of the chuck surface, lift pin openings ("passages") 420, each of which includes its own gas seal ring (outer circular structure around lift pin passages 420 in FIG. 3), and a small gas inlet at 421 in the center of the chuck (inlet not visible in FIG. 3). Each of ground pin openings 418 includes an optional gas seal ring (shown as a circular ring around ground pin openings 418 in FIG. 3). A detail view (inset 422 in FIG. 3) shows circular protrusions 414. Gas seal ring 419, and the gas seal rings of the lift pin openings 420 and ground pin openings 418, may be about 0.1 inches in width and may have an equal height to that of protrusions 414, such as from about 3 microns to about 12 microns, for example about 6 microns, although other widths and heights are possible.

A first aspect disclosed herein includes a method of applying a blanket-coated polymeric coating to a surface of an electrostatic chuck, the method comprising: applying a spray solution to the surface of the electrostatic chuck to form a spray solution coating over the entire surface, the spray solution comprising radiation-curable polymer; exposing the entire surface of the spray solution coating to radiation to form a radiation-cured polymer coating; and heating the radiation-cured polymer coating to an elevated temperature to remove solvent from the radiation-cured polymer coating.

A second aspect according to the first aspect, wherein the radiation-curable polymer comprises radiation-curable epoxy polymer.

A third aspect according to the second aspect, wherein the spray solution comprises at least 75 weight percent organic solvent.

A fourth aspect according to the second or third aspect, wherein the spray solution has a viscosity in a range from 3 to 9 centipoise when applied to the ceramic surface.

A fifth aspect according to any preceding aspect, wherein the surface is at a temperature below 30 degrees Celsius when applying the spray solution to the surface.

A sixth aspect according to any preceding aspect, comprising applying the spray solution to the surface by multiple spray paths, with each spray path passing over the surface in an end-to-end direction, with all spray paths moving in the same end-to-end direction.

A seventh aspect according to any preceding aspect, comprising: applying the spray solution to the entire surface; and exposing the entire surface of the spray solution coating to radiation to form a radiation-cured polymer coating; without heating the surface during or between the applying and the curing.

An eighth aspect according to any preceding aspect, comprising heating the radiation-cured polymer coating to a temperature in a range from 150 to 400 degrees Celsius, for a time of at least 45 minutes.

A ninth aspect according to any preceding aspect, comprising applying the spray solution coating at a thickness in a range from 3 to 5 microns.

A tenth aspect according to any preceding aspect, wherein the surface of the electrostatic chuck consists essentially of ceramic.

An eleventh aspect according to any preceding aspect, wherein the surface of the electrostatic chuck consists of ceramic.

A twelfth aspect according to any preceding aspect, wherein the surface comprises: a ceramic main field, ceramic protrusions extending vertically from the main field, and a continuous ceramic circumferential seal at an outer region of the main field.

A thirteenth aspect according to any preceding aspect, wherein the surface has a roughness in a range from 0.01 to 10 microns Ra.

A fourteenth aspect according to any preceding aspect, wherein the radiation-curable polymer is conductive.

In a fifteenth aspect, an electrostatic chuck comprises a coating applied according to the method of any preceding aspect.

The invention claimed is:

1. A method of applying a blanket-coated polymeric coating to a surface of an electrostatic chuck, the method comprising:
    applying a solution to the surface of the electrostatic chuck to form a solution coating over the entire surface, the solution comprising a radiation-curable polymer;
    exposing the entire surface of the solution coating to radiation to form a radiation-cured polymer coating; and
    heating the radiation-cured polymer coating to an elevated temperature to remove solvent from the radiation-cured polymer coating,
    wherein heating the radiation-cured polymer coating comprises heating the radiation-cured polymer coating to a temperature in a range from 150 to 400 degrees Celsius, for a time of at least 45 minutes.

2. The method of claim 1, wherein the radiation-curable polymer comprises radiation-curable epoxy polymer.

3. The method of claim 2, wherein a spray solution comprises at least 75 weight percent organic solvent.

4. The method of claim 2, wherein the solution has a viscosity in a range from 3 to 9 centipoise when applied to a ceramic surface.

5. The method of claim 1, wherein the surface is at a temperature below 30 degrees Celsius when applying the solution to the surface.

6. The method of claim 1, further comprising applying the solution to the surface by multiple paths, with each path passing over the surface in an end-to-end direction, with all paths moving in the same end-to-end direction.

7. The method of claim 1, further comprising:
    applying the solution to the entire surface; and
    exposing the entire surface of the solution coating to radiation to form a radiation-cured polymer coating;
    without heating the surface during or between the applying and the exposing.

8. The method of claim 1, further comprising applying the solution coating at a thickness in a range from 3 to 5 microns.

9. The method of claim 1, wherein the surface of the electrostatic chuck consists essentially of ceramic.

10. The method of claim 1, wherein the surface of the electrostatic chuck consists of ceramic.

11. The method of claim 1, wherein the surface comprises:
    a ceramic main field,
    ceramic protrusions extending vertically from the main field, and
    a continuous ceramic circumferential seal at an outer region of the main field.

12. The method of claim 1, wherein the surface has a roughness in a range from 0.01 to 10 microns Ra.

13. The method of claim 1, wherein the radiation-curable polymer is conductive.

14. A method of applying a blanket-coated polymeric coating to a surface of an electrostatic chuck, the method comprising:
    applying a solution to the surface of the electrostatic chuck to form a solution coating over the entire surface, the solution comprising a radiation-curable polymer, wherein applying the solution to the surface uses multiple paths, with each path passing over the surface in an end-to-end direction, with all paths moving in the same end-to-end direction;
    exposing the entire surface of the solution coating to radiation to form a radiation-cured polymer coating; and
    heating the radiation-cured polymer coating to an elevated temperature to remove solvent from the radiation-cured polymer coating.

15. The method of claim 14, wherein the surface of the electrostatic chuck consists essentially of ceramic.

16. The method of claim 14, further comprising applying the solution coating at a thickness in a range from 3 to 5 microns.

17. A method of applying a blanket-coated polymeric coating to a surface of an electrostatic chuck, the method comprising:
    applying a solution to the surface of the electrostatic chuck to form a solution coating over the entire surface, the solution comprising a radiation-curable polymer;
    exposing the entire surface of the solution coating to radiation to form a radiation-cured polymer coating; and
    heating the radiation-cured polymer coating to an elevated temperature to remove solvent from the radiation-cured polymer coating,
    wherein the surface comprises:
        a ceramic main field,
        ceramic protrusions extending vertically from the main field, and
        a continuous ceramic circumferential seal at an outer region of the main field.

18. The method of claim 17, wherein the surface has a roughness in a range from 0.01 to 10 microns Ra.

19. The method of claim 17, further comprising applying the solution coating at a thickness in a range from 3 to 5 microns.

* * * * *